(12) United States Patent
Kadatch et al.

(10) Patent No.: US 7,047,480 B2
(45) Date of Patent: May 16, 2006

(54) MATRIX MULTIPLICATION IN A GALOIS FIELD FOR FORWARD ERROR CORRECTION

(75) Inventors: Andrew Kadatch, Redmond, WA (US); Sanjeev Mehrotra, Kirkland, WA (US)

(73) Assignee: Microsoft Corporation, Redmond, WA (US)

(*) Notice: Subject to any disclaimer, the term of this patent is extended or adjusted under 35 U.S.C. 154(b) by 410 days.

(21) Appl. No.: 10/292,215

(22) Filed: Nov. 12, 2002

(65) Prior Publication Data

US 2004/0093550 A1 May 13, 2004

(51) Int. Cl.
*H03M 13/00* (2006.01)

(52) U.S. Cl. ....................................... 714/781
(58) Field of Classification Search ................. 714/781
See application file for complete search history.

(56) References Cited

U.S. PATENT DOCUMENTS

| | | | |
|---|---|---|---|
| 4,675,869 A * | 6/1987 | Driessen | 714/759 |
| 4,703,485 A * | 10/1987 | Patel | 714/779 |
| 5,768,527 A | 6/1998 | Zhu et al. | |
| 6,167,060 A | 12/2000 | Vargo et al. | |
| 6,421,387 B1 | 7/2002 | Rhee | |
| 6,434,191 B1 | 8/2002 | Agrawal et al. | |
| 6,445,717 B1 | 9/2002 | Gibson et al. | |
| 6,473,875 B1 | 10/2002 | Anderson | |
| 6,487,690 B1 | 11/2002 | Schuster et al. | |
| 6,490,705 B1 | 12/2002 | Boyce | |
| 6,532,562 B1 | 3/2003 | Chou et al. | |
| 6,556,588 B1 | 4/2003 | Wan et al. | |

* cited by examiner

*Primary Examiner*—Joseph D. Torres
(74) *Attorney, Agent, or Firm*—Lee & Hayes, PLLC

(57) ABSTRACT

Transreceived packages use forward error correction (FEC) with matrix multiplication in a Galois field of size P (GF(P)) and contain at least a portion of K rows of matrix B having elements $B_{k,m}$ in M columns. Packages include matrix C having elements $C_{n,m}$ for FEC for the K rows. Matrix C has 0 to (N−1)th rows redundant with matrix B data. Elements $C_{n,m}$ are computed by XOR'ing GExp[(GLog[$A_{n,k}$]+GLog[$B_{k,m}$]) mod (P−1)] for k from 0 to (K−1). Matrix A has elements $A_{n,k}$ with N rows and K columns. GExp and GLog are one-dimensional arrays. Matrix A is chosen so up to N rows of B and C (total) can be lost, and B can be recovered. An inverse matrix D is computed from A with the rows of B and C. B is reconstructed from D and the received rows of B and C using another matrix multiplication.

33 Claims, 8 Drawing Sheets

Fig. 3

```
int MUL (int a, int b)
{
    if (a == 0 || b == 0)
        return (0);
    return (GExp[(GLog[a] + GLog[b]) % (P-1)]);
} for (n = 0; n < N; ++n)
{
    for (m = 0; m < M; ++m)
    {
        s = 0;
        for (k = 0; k < K; ++k)
            s ^= MUL (A[n][k], B[k][m]);
        C[n][m] = s;
    }
}
```

Fig. 4A

```
for (n = 0; n < N; ++n)              // N is about 10
{
    for (m = 0; m < M; ++m)          // M is about 100,000
    {
        s = 0;
        for (k = 0; k < K; ++k)      // K is about 20
            s ^= gexp [a[n][k] + glog[B[k][m]]];
        C[n][m] = s;
    }
}
```

Fig. 4B

```
// assume that all cells in C were zeroed
for (n = 0; n < N; ++n)              // N is about 10
{
    for (k = 0; k < K; ++k)          // K is about 20
    {
        aTemp = a[n][k];
        for (m = 0; m < M; ++m)      // M is about 100,000
            C[n][m] ^= gexp [aTemp + glog[B[k][m]]];
    }
}
```

Fig. 5A

```
// assume that all cells in C were zeroed
for (k = 0; k < K; ++k)            // K is about 20
{
    for (n = 0; n < N; ++n)        // N is about 10
    {
        aTemp = a[n][k];
        for (m = 0; m < M; ++m)    // M is about 100,000
            C[n][m] ^= gexp [aTemp + glog[B[k][m]]];
    }
}
```

Fig. 5B

```
// assume that all cells in C were zeroed
for (k = 0; k < K; ++k)            // K is about 20
{
    for (m = 0; m < M; ++m)        // M is about 100,000
        bTemp[m] = glog[B[k][m]];
    for (n = 0; n < N; ++n)        // N is about 10
    {
        aTemp = a[n][k];
        for (m = 0; m < M; ++m)
            C[n][m] ^= gexp [aTemp + bTemp[m]];
    }
}
```

Fig. 6

```
#define BTEMP_SIZE  128                              // elements in bTemp

// assume that all cells in C were zeroed
for (k = 0; k < K; ++k)                              // K is about 20
{
    //
    // process BTEMP_SIZE elements from k-th row at once
    // so that they always stay in L1 cache
    //
    for (m = 0; m < M - BTEMP_SIZE; m += BTEMP_SIZE)
    {
        // prepare next portion of k-th row of B
        for (i = 0; i < BTEMP_SIZE; ++i)             // UNROLL
            bTemp[m] = glog[B[k][m + i]];
        for (n = 0; n < N; ++n)                      // N is about 10
        {
            aTemp = a[n][k];
            for (i = 0; i < BTEMP_SIZE; ++i)         // UNROLL
                C[n][m + i] ^= gexp[aTemp + bTemp[i]];
        }
    }
    // process remaining elements of k-th row
    for (i = 0; i + m < M; ++i)
        bTemp[i] = glog[B[k][m + i]];
    for (n = 0; n < N; ++n)                          // N is about 10
    {
        aTemp = a[n][k];
        for (i = 0; i + m < M; ++i)                  // M is about 100,000
            C[n][i + m] ^= gexp[aTemp + bTemp[i]];
    }
}
```

```
define BTEMP_SIZE    128                                    // elements in bTemp // assume that all cells in C were zeroed
for (k = 0; k < K; ++k)                                      // K is about 20
{
    //
    // process BTEMP_SIZE elements from k-th row at once
    // so that they always stay in L1 cache
    //
    bAddr = B[k] + 0;
    for (m = 0; m < M - BTEMP_SIZE; m += BTEMP_SIZE)
    {
        // prepare next portion of k-th row of B
        for (i = 0; i < BTEMP_SIZE; ++i)                     // UNROLL
            bTemp[m] = glog[bAddr[i]];
        bAddr += BTEMP_SIZE;
        cAddr = c[0] + m;                                    // shift to next portion
        for (n = 0; n < N; ++n)                              // N is about 10
        {
            aTemp = a[n][k];
            gAddr = gexp + aTemp;
            for (i = 0; i < BTEMP_SIZE; ++i)                 // UNROLL
                cAddr[i] ^= gAddr[bTemp[i]];
            cAddr += M;                                      // shift to next line
        }
    }
    // process remaining elements of k-th row
    for (i = 0; i + m < M; ++i)
        bTemp[i] = glog[bAddr[i]];
    for (n = 0; n < N; ++n)                                  // N is about 10
    {
        aTemp = a[n][k];
        gAddr = gexp + aTemp;
        cAddr = c[0] + m;
        for (i = 0; i + m < M; ++i)                          // M is about 100,000
            cAddr[i] ^= gAddr[bTemp[i]];
        cAddr += M;                                          // shift to next line
    }
}
```

```
#define BTEMP_SIZE 8

...
// instead of
//  for (i = 0; i < BTEMP_SIZE; ++i)          // UNROLL
//      bTemp[m] = glog[bAddr[i]];
// unroll the loop like bTemp[0] = glog[bAddr[0]];
bTemp[1] = glog[bAddr[1]];
bTemp[2] = glog[bAddr[2]];
bTemp[3] = glog[bAddr[3]];
bTemp[4] = glog[bAddr[4]];
bTemp[5] = glog[bAddr[5]];
bTemp[6] = glog[bAddr[6]];
bTemp[7] = glog[bAddr[7]];
...
```

MATRIX MULTIPLICATION IN A GALOIS FIELD FOR FORWARD ERROR CORRECTION

TECHNICAL FIELD

The present invention relates generally to communication networks, and more particularly to methods, apparatuses, computer programs, and systems that provide forward error correction for transreceived data over wired and/or wireless connections/networks by using matrix multiplication in a Galois field.

BACKGROUND

The Internet and other similar networks are currently being used to transmit and receive (e.g. transreceive) data. An example of transreceived data is the request and delivery of streaming media from a server device to a client device. For example, audio and/or video content from news broadcasts can be streamed, from a server device/devices, through a network to one or more client devices.

The terms "streaming media" and "streamed media", as used herein, essentially mean real-time or near-real-time delivery of critical content (e.g., audio and/or video data) to a subscribing user's client device or devices. The client device/devices render the streamed media in a way that is appropriate for the client device and the media. By way of example, a live or previously recorded radio program can be transmitted as streamed audio data over a network to a wireless communication device, such as, e.g., a mobile telephone device, which then reproduces the audio signal.

To provide better service to the user, some networks that are used for streaming media are beginning to offer predictable levels of service. For example, in certain networks, an attempt is made to maintain both the throughput of the network connections (i.e., the data rate) and the errors introduced into data transmitted on those connections (i.e., the residual bit error rate or BER) within certain predicted limits, for the duration of a connection. An example of such a network is the so-called "third generation" (3G) wireless network. 3G wireless networks are being designed to support high data rate wireless telephone services. Streaming content services are predicted to be major applications in these and other types of networks. Such services will be required to deal with certain levels of BER while maintaining an acceptable streaming content experience for subscribing users. As such, in many of these networks there is a need for error correction services that reduce the amount of corrupted data.

Forward error correction (FEC) in packet networks is a well-known error correction technique to provide a mechanism by which a sending device provides a receiving device with additional FEC data that can be subsequently used by the receiving device to detect and correct errors in received data. Thus, to support FEC the sending device typically includes an FEC encoder and the receiving device typically includes an FEC decoder, each of which performs an aspect of FEC using Error Correction Codes (ECCs). ECCs are special codes extensively used in telecommunications for reliable data transmission over noisy channels. These codes increase the size of the transmitted data in such a way that modifications of transmitted data that are caused by noise in the data channel can be reverted on receiving end.

One kind of ECCs are FEC codes. FEC codes allow restoration of large portions of missed or damaged data when a recipient cannot request resending of data from the sender. A typical application is a cellular telephone. Even if the recipient's receiver is temporarily shadowed from the transmitter, such as when the cellular telephone is passing through a tunnel or going under a bridge, the use of FEC codes allows for a smooth playback using the data that is recovered from previously received packages.

A practical implementation of FEC codes is difficult because of the large number of clients that are supported by one retransmitting module. Each client requires a separate and independent encoding stream which can cause overloading of the retransmitting module's computational capacities.

On the receiving end, the use of FEC codes can prove to be difficult because the client receiver typically has a slower processor without the computational capacity that is required by data restoration algorithms. Efficient implementations of FEC codes are, therefore, important for telecommunications. Modem FEC code algorithms are most computationally intensive in encoding and decoding by multiplying matrices in a Galois field.

Some FEC code algorithms are implemented in hardware but are not adequate for general use because they are expensive and require hardware upgrades that increase the cost of ownership even further, often where impractical-such as in the replacement of existing cellular telephones. In that matrix multiplication in a Galois field requires the majority of total encoding and decoding processing time, in would be an advance in the art to devise an efficient implementation. Consequently, there is a need for improved methods, apparatuses, computer programs, and systems that can provide such a capability.

Some matrix multiplication algorithms are not applicable for operation in a Galois field. Still other algorithms are applicable to matrix multiplication in a Galois field but they are either so complicated that their practical usability is questionable (e.g. such as algorithms of Strassen-Winograd family), or they are targeted to be used only for special forms of matrixes such as tri-diagonal, five-diagonal, sparse, etc.

SUMMARY

A transmission package that is transmitted or received contains at least a portion of K rows of a matrix B having elements $B_{k,m}$ in M columns. A matrix C having elements $C_{n,m}$ for forward error correction for the K rows of the data is also included in the transmission package. Matrix C has from 0 to an (N−1)th row that are redundant with the data in matrix B. Each element $C_{n,m}$ is computed for a Galois field GF(P) of size P where integer P is the number of different values that data elements $B_{k,m}$ can take (usually, P is integral power of 2, e.g. $P=2^8=256$) by XOR'ing GExp[(GLog $[A_{n,k}]$+GLog$[B_{k,m}]$) mod (P−1)] for k from 0 to (K−1). Each element $A_{n,k}$ is in a matrix A having N rows and K columns. GExp and GLog are each retrieved from respective one-dimensional precomputed arrays. The matrix A is chosen beforehand and is known to both the encoder and decoder. It is usually chosen so that up to N rows of B and C (total) can be lost, and B can still be perfectly recovered at the decoder end. At the decoder end, an inverse matrix D is computed from A using information on the rows of B and C which are received. B is then reconstructed from D and the received rows of B and C using another matrix multiplication. At both encoder and decoder ends, a matrix multiplication over a Galois field of size P occurs. Since this computation is the core of both encoder and decoder algorithms, optimization techniques for computing this operation are desirable.

BRIEF DESCRIPTION OF THE DRAWINGS

A more complete understanding of the various methods, apparatuses, computer programs, and systems of the present invention may be had by reference to the following detailed description when taken in conjunction with the accompanying drawings wherein.

DETAILED DESCRIPTION

Turning to the drawings, wherein like reference numerals refer to like elements, implementations of the invention are illustrated in a general network environment. Although not required, portions of the invention are described in the general context of computer-executable instructions, such as program modules, being executed by a computer or like device, which, for example, may take the form of a personal computer (PC), a workstation, a portable computer, a server, a plurality of processors, a mainframe computer, a wireless communications base station, a hand-held communications device such as a cellular telephone, a streamed media player, a set-top box, etc.

General Network Structure

Figure 1:
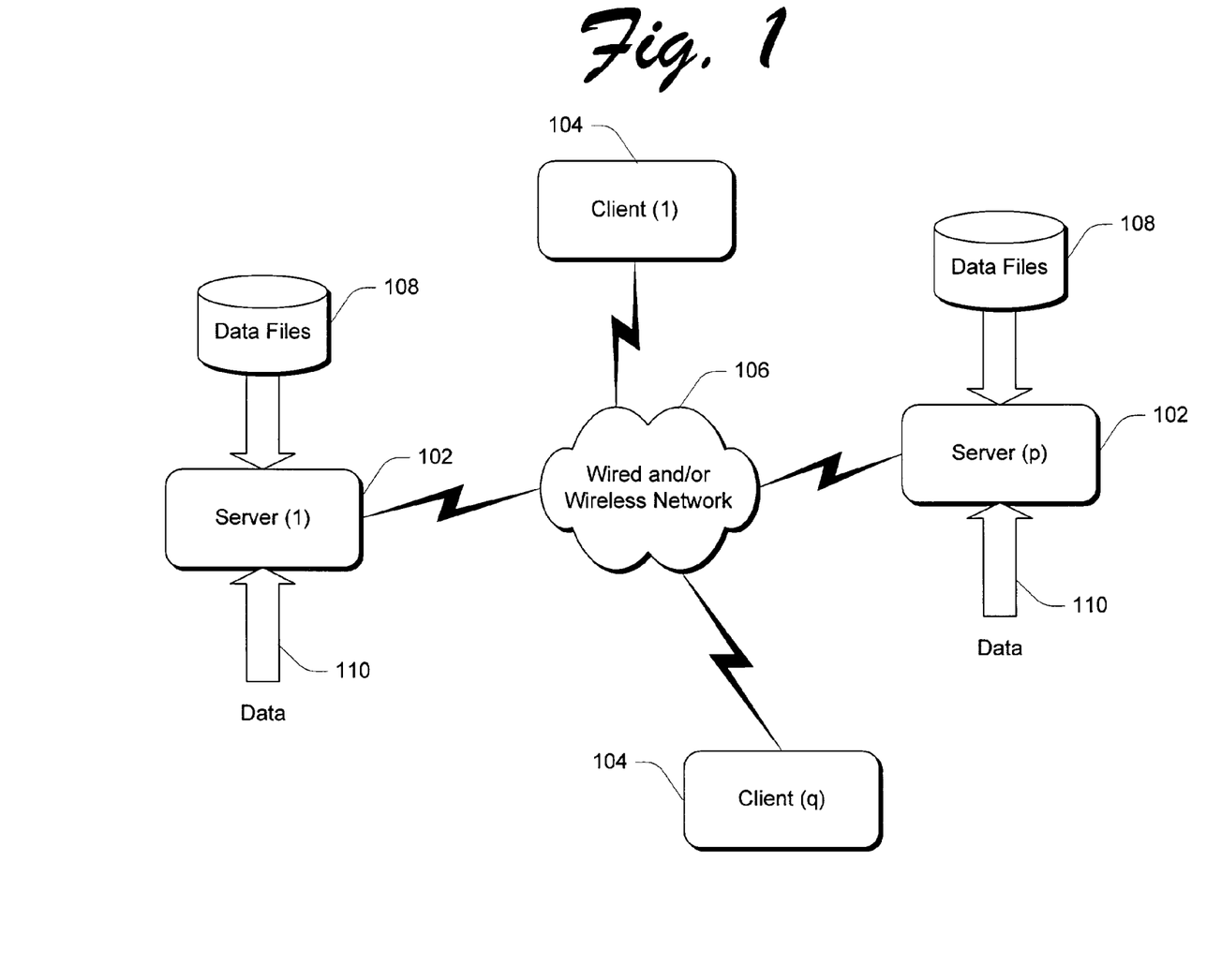
FIG. 1 is a block diagram, in accordance with an implementation of the present invention, of a networked client/server system.

FIG. 1 shows a client/server network system and environment, in accordance with an implementation, for transreceiving data over wired or wireless IP channels and networks. Generally, the system includes one or more (p) network server computers 102, and one or more (q) network client computers 104. The computers communicate with each other over a data communications network, which in FIG. 1 includes a wired and/or wireless network 106. The data communications network might also include the Internet or local-area networks and private wide-area networks. Network server computers 102 and network client computers 104 communicate with one another via any of a wide variety of known protocols, such as the Transmission Control Protocol (TCP) or User Datagram Protocol (UDP). Each of the p network server computers 102 and the q network client computers 104 can include a codec for performing coding and decoding for data that is respectively transmitted and received.

Network server computers 102 have access to data including streaming media content in the form of different media streams. These media streams can be individual media streams (e.g., audio, video, graphical, etc.), or alternatively composite media streams including multiple such individual streams. Some of the data can be stored as files 108 in a database or other file storage system, while other data 110 might be supplied to the network server computer 102 on a "live" basis from other data source components through dedicated communications channels or through the Internet itself. The data received from network server computers 102 are rendered at the network client computers 104.

As shown in FIG. 1, the network system in accordance with an implementation of the invention includes network server computer(s) 102 from which a plurality of media streams are available. In some cases, the media streams are actually stored by network server computer(s) 102. In other cases, network server computer(s) 102 obtain the media streams from other network sources or devices. The system also includes network client computer(s) 104. Generally, the network client computer(s) 104 are responsive to user input to request media streams corresponding to selected content. In response to a request for a media stream corresponding to the content, network server computer(s) 102 streams the requested media streams to the network client computer 104. The network client computer 104 renders the data streams to produce a presentation.

The codecs of each of network server computers 102 and each of network client computers 104 can perform forward error correction techniques using matrix multiplication in a Galois field. This matrix multiplication involves two matrixes $A_{N \times K}$ and $B_{K \times M}$ producing matrix $C_{N \times M}$, which is defined as:

$$C_{n,m} = \sum_{k=0}^{K-1} A_{n,k} \cdot B_{k,m}.$$

The matrix C is formed in a transmission package that is transmitted or received and includes elements $C_{n,m}$ for forward error correction for the K rows of data in matrix B. The transmission package also usually includes all of the K rows of data in the matrix B. The matrix B is the original data that was requested by network client computers 104 from network server computers 102. The matrix B includes elements $B_{k,m}$. The kth row of matrix B is an expression of one row of the data and k has a value from 0 to (K–1). The original data requested is organized into a matrix with K rows and M columns. The m is a matrix column number and has a value from 0 to M–1. The matrix C has elements $C_{n,m}$ with n from 0 to N–1 (N rows) and m from 0 to M–1 (M columns). The M is the number of symbols in each row of the data and the nth row of matrix C is an expression of one redundant block of the data and n has a value from 0 to N–1. The matrix A is an N rows by K column matrix and has elements $A_{n,k}$. When data is lost in a transmission thereof, the redundant data in matrix C is used in FEC algorithms to reconstruct the original K rows of the data in matrix B.

Figure 2:
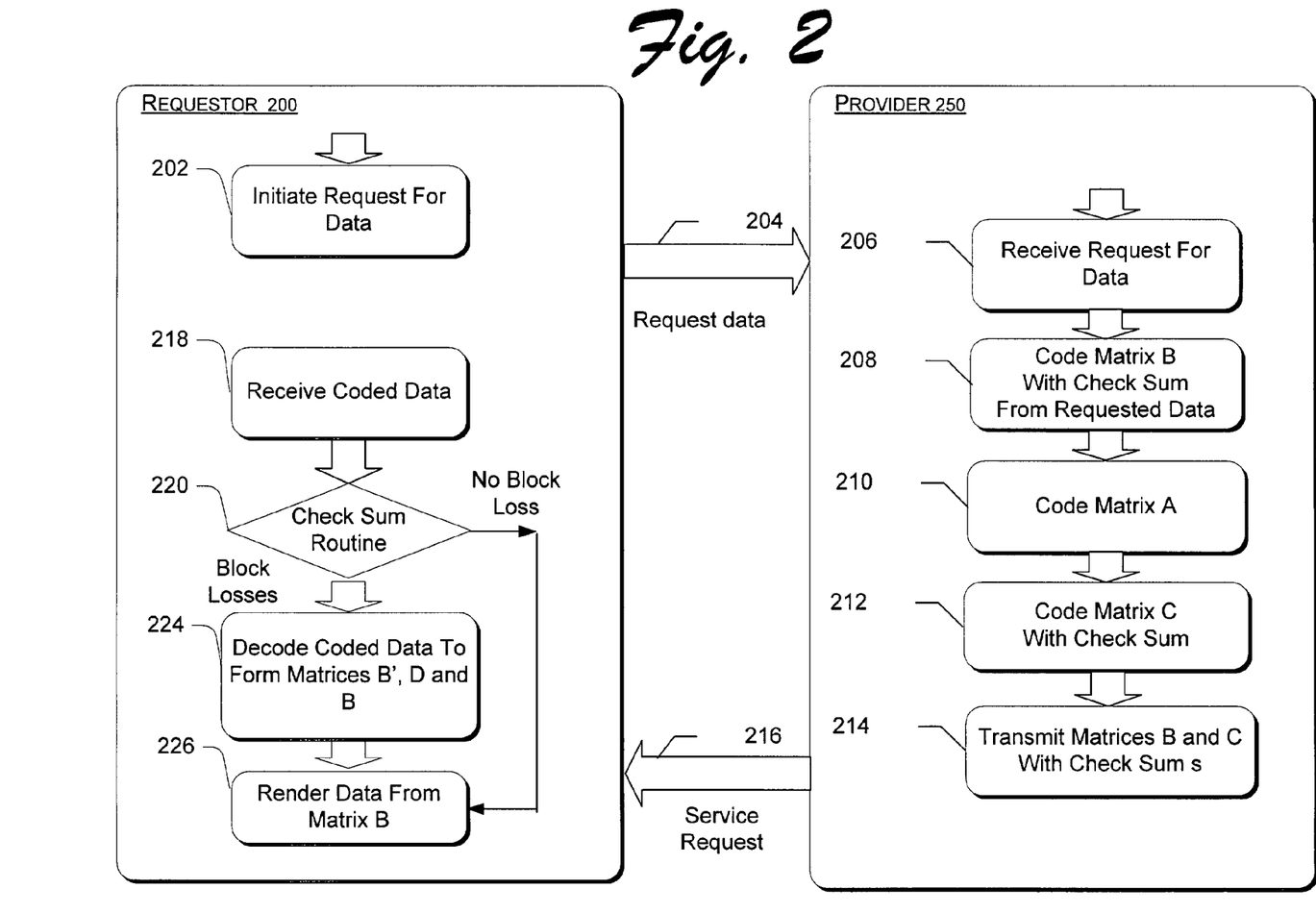
FIG. 2 is a block diagram, in accordance with an implementation, illustrating communications between a requestor and a provider, where the provider sends coded data with forward error correction to the requestor and the requestor can decode and render the coded data.

FIG. 2 is a flow chart that illustrates an implementation in which data is requested and then communicated in response to the request. A requestor 200 initiates a request for data at block 202. The request is communicated in a transmission 204 to a provider 250. Requestor 200 and provider 250 can be any one of the p network server computers 102 or any one of the q network client computers 104 in FIG. 1. Provider 250 receives the request of the data at block 206. The provider 250 can retrieve the data from data files or from streaming data, such as are respectively seen at reference numerals 108 and 110 in FIG. 1. When so retrieved, the provider 250 uses a codec to code the matrices B and C. The matrix B contains the requested data so as to have K rows and M columns. A check sum can also added at block 208 to each row and/or each column of matrix B (typically the checksum is only added to a row of matrix B, which corresponds to a packet). The requestor 250, at block 210, uses matrix B to form the matrix C that containing a sufficient amount of redundant data from matrix B such that matrix B could be reconstructed, given that a likely number of block of matrix B are lost in the requested transmission of the data. At block 212, the provider 250 uses matrix multiplication of matrices A and B to form matrix C. A check sum for matrix C can also be added into the rows and/or columns of matrix C (typically for the rows). The matrices B and C are formed into a transmission package at block 214 and a transmission 216 is made to requester 200 from provider 250.

At block 218, the requestor 200 receives the transmission package. A check sum routine can be executed upon the transmission package at block 220. The check sum routine can evaluate check sums in the transmission package to determine if data has been lost in the transmission 216 that was used to service the request of the requestor 200. If no data has been lost as determined by the check sum routine, then the requestor 200 renders the requested data from matrix B in the transmission package at block 226. Otherwise, one or more blocks of data are deemed to have been lost and the requestor performs a decoding routine with its codec at block 224. This is done by the following algorithm. Assume the provider sends matrix B and C calculated from the following matrix multiplication:

$$\begin{bmatrix} B \\ C \end{bmatrix} = \begin{bmatrix} I \\ A \end{bmatrix} B = A'B.$$

The only real multiplication here is C=AB, since I is the K×K identity matrix. Then if the requestor receives at least K rows of B and C (total), i.e., there are less than N total rows lost, then using any of the K received rows, the decoder knows that B'=A"B, where B' is a matrix formed by taking K rows from the received rows of B and C, and A" are the corresponding rows in matrix A'. Then, the decoder can simply reconstruct B using B=(A")$^{-1}$B', where (A")$^{-1}$ is the inverse of matrix A". If D=(A")$^{-1}$, then B=DB', which again involves a matrix multiplication.

At block 224, the coder/decoder (codec) of the requester 200 decodes the coded data in the transmission package to form matrices B' and D using matrix A and information on the rows of B and C which are received. Matrices B' and D are then used to reconstruct the original data in matrix B. Then, at block 226, the requester 200 renders the originally requested data.

In the discussion below, implementations of the invention will be described in the general context of computer-executable instructions, such as program modules, being executed by one or more conventional personal computers. Generally, program modules include routines, programs, objects, components, data structures, etc. that perform particular tasks or implement particular abstract data types. Moreover, those skilled in the art will appreciate that the invention may be practiced with other computer system configurations, including hand-held devices, multiprocessor systems, microprocessor-based or programmable consumer electronics, network PCs, minicomputers, mainframe computers, and the like. Alternatively, the invention could be implemented in hardware or a combination of hardware, software, and/or firmware. For example, one or more application specific integrated circuits (ASICs) could be programmed to carry out the invention. The various exemplary implementations of the present invention may also be practiced in distributed computing environments where tasks are performed by remote processing devices that are linked through a communications network. In a distributed computing environment, program modules may be located in both local and remote memory storage devices.

In order to simply the computational intensity of matrix multiplication of forward error correction algorithms, a finite Galois field of a size P (denoted as GF(P)) can be employed. GF(P), where P is a power of 2 (P=2$^b$) consists of integers from 0 to (P-1) with arithmetic operations defined as a ⊕ b=a XOR b, where XOR is a bitwise exclusive OR operation (0 XOR 1=1, 0 XOR 0=1 XOR 1=0) performed on all bits of binary representations of a and b. As such, this multiplication is defined as:

$$a \otimes b = \begin{cases} 0 \text{ if } a = 0 \text{ or } b = 0, \\ G\text{Exp}((G\text{Log}(a) + G\text{Log}(b)) \bmod (P-1)) \end{cases}$$

where GExp and GLog are specifically selected functions that map integer values as follows:

GLog:[1 ... P-1]→[0 ... P-2];

G Exp:[0 ... P-2]→[1 ... P-1].

GLog and GExp are similar to a regular exponent and a regular logarithm and therefore may be used as shown to evaluate the result of a·b=exp$^{log(a\ b)}$=exp$^{log(a)+log(b)}$. It should be stressed that above formula for addition operation in GF(P) is applicable if and only if P is integral power of 2 which is typically the case on practice; should it be not so, addition operation should be redefined accordingly to laws of linear algebra. For the sake of simplicity and uniformity, from here on it will be assumed that P is integral power of 2. Such assumption does not limit or reduce the scope or applicability of invention.

Further material set forth herein will not rely on specific properties of a Galois field, but rather can be used with the arbitrary finite mapping functions of GLog and GExp. Therefore, the details of the creation of those functions that are specific to operations in GF(P) are omitted.

An implementation of a matrix multiplication in GF(P) can be made efficient by advantageously taking into consideration that the matrices $B_{K \times M}$ and $C_{N \times M}$ are narrow (e.g. fewer rows than columns). The typical values for N, K, and M are, respectively approximately 100, 100, and 4,000. As such, $A_{N \times K}$ is about 10,000 bytes, $B_{K \times M}$ is about 40,000 bytes, and $C_{N \times M}$ is about 40,000 bytes. An implementation multiplies the relatively small matrix A by the large and narrow matrix B and produces another large and narrow matrix C. In that the matrix A has fixed contents, the contents of matrix A depends only on its dimensions. As such, matrix A needs to be created only once and therefore may be organized in a way that is most suitable for exploiting efficiency in computations. Unlike matrix A, matrix B contains user-specific data and therefore no assumptions may be made about its contents.

Cache Size and Access Time Considerations

Modem Central Processor Units (CPUs) have a multilayered cache in their memory architecture. One layer, L1 cache, can be accesses faster than other layers (e.g. L2 cache, L3 cache, etc.). While L1 cache can be accessed fast, typically in one (1) CPU cycle, it can hold only a few thousand bytes (typically, 8–32,000 bytes). The L2 cache can be accessed typically in 6–10 cycles and can hold 128–512,000 bytes. Some architectures incorporate an L3 cache that can be accessed in 15–50 cycles and can hold several millions bytes.

The CPU interfaces with a main memory. Access to the main memory is significantly slower when compared to the access time of the CPU to the cache, which is typically 100–200 CPU cycles. Additionally, rather than storing single bytes, the cache stores cache lines which each contain 32–128 consecutive bytes of data. As such, the CPU performs sequential data access and access to multibyte data entities in the cache. The data so accessed by the CPU is treated as a single unit (such as 2-byte words, 4-byte double words, 8-byte quad words, and 16-byte double quad words), which is significantly faster than single byte accesses. Once the CPU requests a byte from the main memory, an entire cache line that contains the requested byte is retrieved. The retrieved cache line is then propagated into all cache layers (e.g. L1, L2, L3, etc.). When the CPU needs data that is stored close to the requested byte of data, that data will have already been retrieved and is available by propagation into one of the layers of the cache.

Modem CPUs often function in an assembly line fashion in that they divide an instruction into 7–20 simpler stages that are executed sequentially and are interleaved. When a k-th stage finishes the processing of one of the instructions, the results of the k-th stage are passed on to the sequentially next stage that then starts processing the next instruction. All such stages can work in parallel. Because of the assembly line technique of CPUs, changes in the program control flow can be costly. For example, when the CPU receives an instruction that may direct the program control flow into another yet-unknown location (e.g. conditional jumps, indirect calls), the CPU may need to reload its assembly line of sequentially processed instructions from the beginning, thus causing a lengthy delay in program execution (e.g. 5–15 cycles).

Considering the significant difference between the access time of cached data and non-cached data, as well as the difference between sequential accesses and random accesses, and the difference between sequential program control flow and mixed program control flow, matrix multiplication algorithms can be implemented that efficiently utilize cache storage, maintain good data locality (e.g. referencing data mostly in a sequential manner), and dedicate the majority of processing time to the processing of long sequences of sequential instructions.

Efficiencies Realized by Use of Look Up Tables

Figure 3:
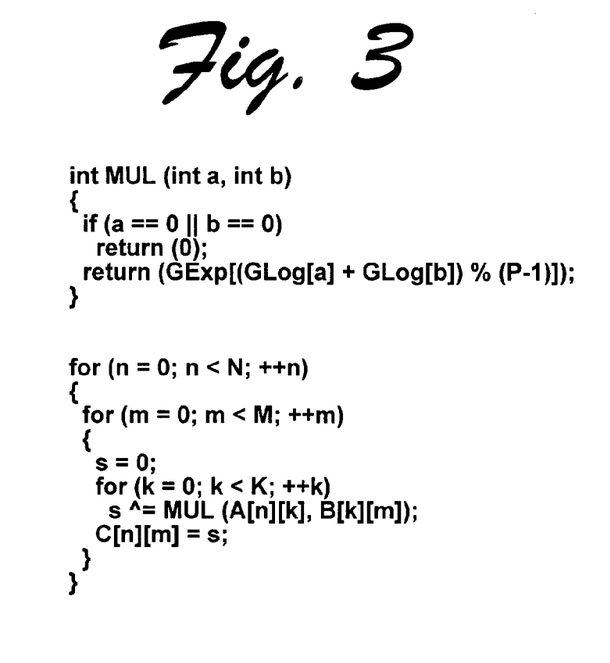
FIGS. 3–8 are various examples of computer code for illustrating implementations described herein of forward error correction using matrix multiplication in a Galois field.

FIG. 3 shows computer code for an implementation of a matrix multiplication function in GF(P). The code set forth in FIG. 3 can be made more efficient by several implementations described below. Once such efficiency can be accomplished by increasing the speed of the 'MUL' function seen in FIG. 3. One way to do this is by multiplying the integer values within the limited range [0, P–1], and thereby create a P×P multiplication lookup table 'MulTable'. Then, the result of MUL(a,b) can be retrieved from the respective 0le[a,b] cell as opposed to the complex computation: Eq. 1:

$$a \otimes b = \begin{cases} 0 \text{ if } a = 0 \text{ or } b = 0, \\ GExp[(GLog[a] + GLog[b]) \mod(P-1)] \end{cases}$$

The result of MUL(a,b) can be computed in single table lookup of: $a \hat{\otimes} b = \text{MulTable}[a][b]$. With respect to deriving each element $C_{n,m}$ for the matrix C in a forward error correction algorithm, the two dimensional table is formed so as to have P rows and P columns. A lookup can be performed to compute $C_{n,m}$ as $C_{n,m} = \text{MulTable}[A_{n,k}][B_{k,m}]$.

The two dimensional table approach can be improved upon due to the size of the resultant multiplication table. Typically, an algorithm operates on bytes, so that the computations are done in a Galois field of size $P=256=2^8$. So, when P=256, then a two-dimensional multiplication lookup table will have 256*256=65,536 cells, as compared to 256–1024 cells that are needed for flat logarithm and exponentiation tables. A consequence of this large size is that the multiplication table (e.g. 'MulTable') will not fit into the cache to which the CPU has the fastest access (e.g. L1 cache). Rather, the multiplication table may have to be stored in the larger L2 cache to which there is a reduced speed of access of 6–10 cycles of the CPU in order to arrive at the desired multiplication result.

The main advantages of using a single lookup table for matrix multiplication are that the computationally intensive modulo operation seen in Eq. 1, above, can be avoided, and that there is no need to check to see whether the value of any of the multiplication operands is zero.

The two dimensional single look up table approach discussed above can be further improved upon by refining GLog and GExp into respective one dimension tables as follows:

glog(j)=GLog(j) if j≠0 (2P–3) if j=0; and
gexp(j)=GExp(j mod P–1)) if j<(2P–3); 0 if j≧(2P–3).

By using the redefined tables for glog(j) and gexp(j), multiplication may be implemented without checking the values of the operands $a\hat{\otimes}b = \text{gexp}[\text{glog}[a]+\text{glog}[b]]$. If both a and b are different from 0,
glog[a]=GLog[a]≦P–2
glog[b]=GLog[b]≦P–2, therefore glog[a]+glog[b]=GLog[a]+GLog[b]≦2P–4<2P–3 and by definition of gexp: gexp[glog[a]+glog[b]]=GExp[(GLog[a]+GLog[b]) mod (P–1)].

One the other hand, if either a or b is 0, then glog[a] and/or glog[b] will equal 2P–3, and therefore (glog[a]+glog[b]) will be greater than or equal to 2P–3. Thus, by definition of gexp: gexp[glog[a]+glog[b]]=gexp[≧(2P–3)]=0. The size for the glog table is the same as for G log since a and b are less than or equal to P–1. The size for the exponentiation table is larger since now the maximum for glog[a] and glog[b] is 2P–3. Thus, glog[a]+glog[b]<=4P–6. So, the size for this table is 4P–-5.

Both the original variant of 'MUL' function implementation seen in the code of FIG. 3 and, in most cases, the use of the two-dimensional lookup table described above, are inferior to the use of the one dimensional refined tables for glog and gexp since the redefined exponentiation table is only approximately four (4) times larger than original one— the logarithm table size did not change. As such, the size of the one dimensional redefined tables are such that they will each fit into the L1 cache and will thus be accessed in just one CPU cycle. Accordingly, the multiplication will be performed in only 4 cycles (e.g. the two logarithm operations require 2 cycles, one cycle is required to add the logarithm operations, and one cycle is required to exponentiate the added logarithm operations), as compared to the 6–10 cycles that would otherwise be required in order to access the two-dimensional multiplication table in L2 cache, or as compared to two 5–15 cycles penalties that would be caused by a mispredicted branch during an operand check in the original version of the 'MUL' function implementation as seen in the code in FIG. 3. The foregoing cycle savings can be further appreciated when considering the other cycles that would otherwise be required (approximately 5–20 cycles) for the computationally intensive modulo operation as seen in the code in FIG. 3.

In summary, a one-dimensional array for glog and for gexp can be formed so that the glog table has P elements (j is an integer from 0 to P−1) and the gexp table has 4P−5 elements (j is an integer from 0 to 4P−6), P is the size of a Galois field (GF(P)). A forward error correction algorithm can then evaluate each element $C_{n,m}$ in matrix C by substituting GLog and GExp by respective lookups in the array glog and in the array gexp as:

$$C_{n,m} = \underset{k=0}{\overset{K-1}{XOR}} G\text{Exp}[(G\text{Log}[A_{n,k}] + G\text{Log}[B_{k,m}]) \bmod (P-1)]$$

$$= \underset{k=0}{\overset{K-1}{XOR}} g\exp[g\log[A_{n,k}] + g\log[B_{k,m}]].$$

In order to utilize L1 cache, neither the glog array nor the gexp array should be larger than $3.2 \times 10^4$ bytes. Also, it is advantageous if P is not more than 256, N is not more than 100, K is not more than 100, and M is at least 4,000. Accordingly, the size of the matrix A should not be more than $3.2 \times 10^4$ bytes, the size of the matrix B should not be less than $2 \times 10^4$ bytes, and the size of the matrix C should not be less than $10^4$ bytes.

Efficiencies From Removal of Invariants From Computational Loops

By using the redefined one dimensional tables for glog and gexp discussed above, the matrix multiplication in the Galois field GF(P) may be written as follows:

$$C_{n,m} = \underset{k=0}{\overset{K-1}{XOR}} g\exp[g\log[A_{n,k}] + g\log[B_{k,m}]].$$

Since one of the operands in the matrix multiplication used by the FEC algorithm described herein has a constant value, a fixed matrix/operand $a'_{n,k}$ can be computed as $g\log[A_{n,k}]$, where the matrix $A_{N,K}$ is small and fixed (approximately 10×20). Then, making a substitution of $a'_{n,k}$ for $g\log[A_{n,k}]$, the result is:

$$C_{n,m} = \underset{k=0}{\overset{K-1}{XOR}} g\exp[a'_{n,k} + g\log[B_{k,m}]],$$

which shows that the use of precomputed fixed matrix elements $a'_{n,k}$ do not require logarithm computations so as to readily improve performance of the matrix multiplication for the elements $C_{n,m}$ of matrix C.

Cache Efficiencies

There are at least two orders of magnitude difference in access times to cached and uncached data. As such, the importance of efficient use of cache in matrix multiplication algorithms cannot be overstated. Blocking can be used to improve cache efficiency. In blocking, instead of multiplying matrixes, each matrix is split into smaller sub-matrixes of such size that three smaller sub-matrixes (from matrices A, B, and C) will fit into cache (e.g. L1 cache). Given matrix dimensions typical for FEC applications, blocking will only rearrange the computations and the matrix A, which is typically as large as 10,000 bytes. Matrix A will be so small that splitting matrix A into still smaller sub-matrixes will not achieve any computational benefits.

Figure 4A:
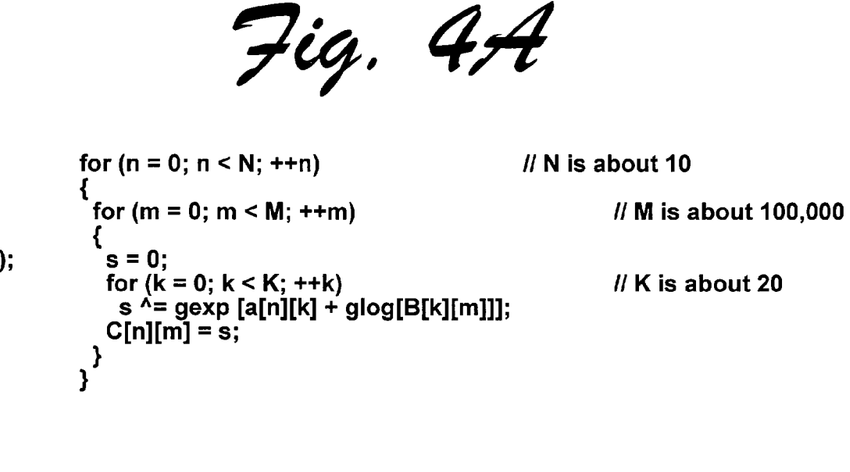

Any efficient use of cache in matrix multiplication algorithms (e.g. 'cache-friendly'), must take into consideration that matrix C has significantly more columns than rows (e.g. a narrow matrix). One such consideration to accomplish efficiency is to rewrite the matrix multiplication algorithm such that the calculation loops occur in a different order. An example of this is seen by comparing the code in seen in FIG. 4A with that of FIG. 4B. The code seen in FIG. 4B accesses both matrixes C and B sequentially in a large inner loop which is better than the code in FIG. 4A which accesses the large matrix B out of order, thus reducing cache efficiency. Accordingly, each element $C_{n,m}$ in matrix C can be calculated as $g\exp[a'_{n,k}+g\log[B_{k,m}]]$ during which m is looped within k and k is looped within n. Moreover, while performing the calculation of each element $C_{n,m}$, each loop of k is performed within in n to calculate aTemp=a[n][k], and for each loop of m within k, the calculation of $g\exp[a'_{n,k}+g\log[B_{k,m}]]$ is replaced with $g\exp[a\text{Temp} +g\log[B_{k,m}]]$.

Figure 4B:
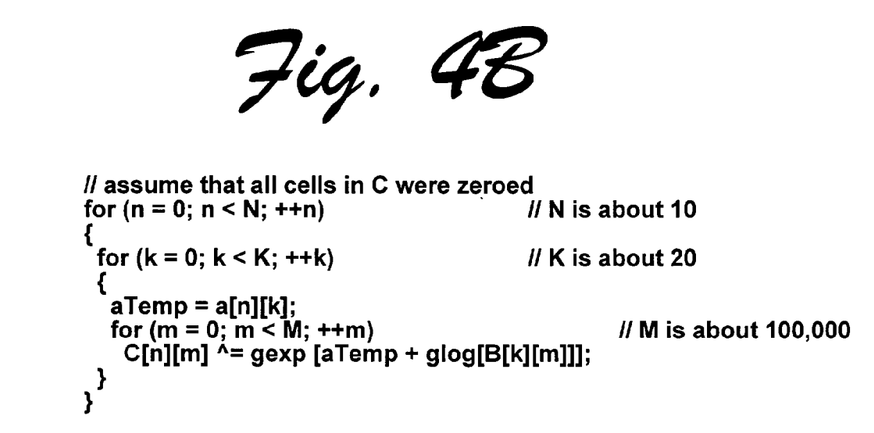
Figure 5A:
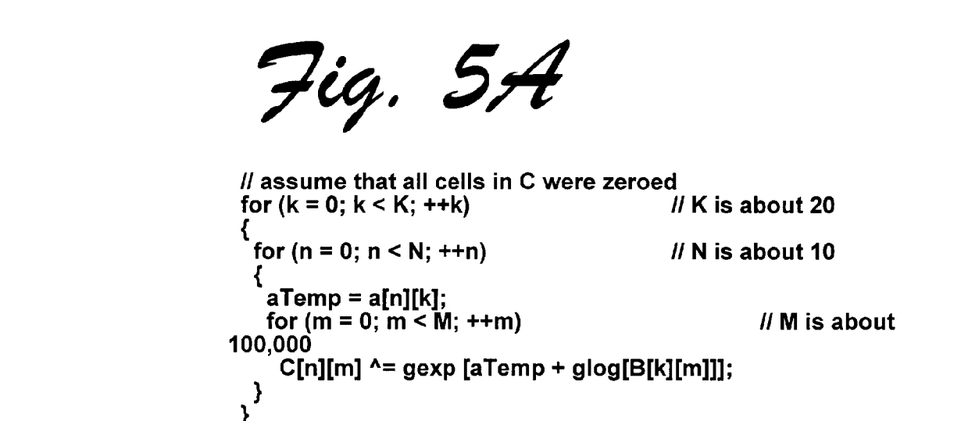

A further improvement to efficiency that could be made to the algorithm illustrated by the code in FIG. 4B is by a more efficient evaluation of $g\log[B_{k,m}]$ in the innermost loop. For each k and m, the logarithm of $B_{k,m}$ is being evaluated as many as N times whereas, ideally, each needs to be evaluated only once. To do so, the first order of the calculation loops should be changed. As such, instead of iterating first by n and then by k, the order is changed so as to use 'k' for the first outer loop and so as to use 'n' for the nested loop, as is demonstrated by the code seen in FIG. 5A.

Figure 5B:
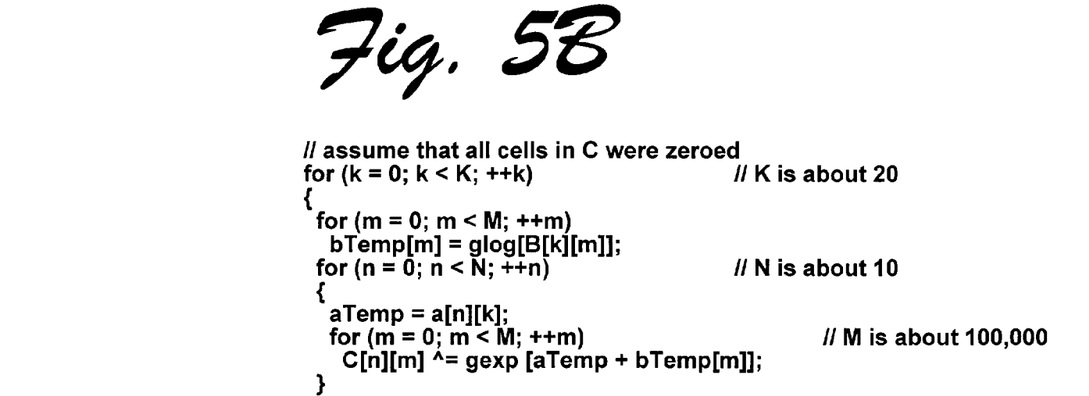

For a still further efficiency, a temporary array 'bTemp' can be employed to hold precomputed values of $g\log[B_{k,m}]$. Then, the calculation of the logarithm in the inner loop can be completely avoided, as is demonstrated by the code seen in FIG. 5B. The code of FIG. 5B shows a matrix multiplication algorithm in which all arrays are accessed sequentially in the innermost loop and the logarithms are evaluated only once. Thus, each element $C_{n,m}$ can be calculated using gexp[aTemp+bTemp[m]] during which:

m is looped within n to compute aTemp=$a'_{n,k}$;

n is looped within k; and m is looped within k to compute bTemp[m]=$g\log[B_{k,m}]$.

Figure 6:
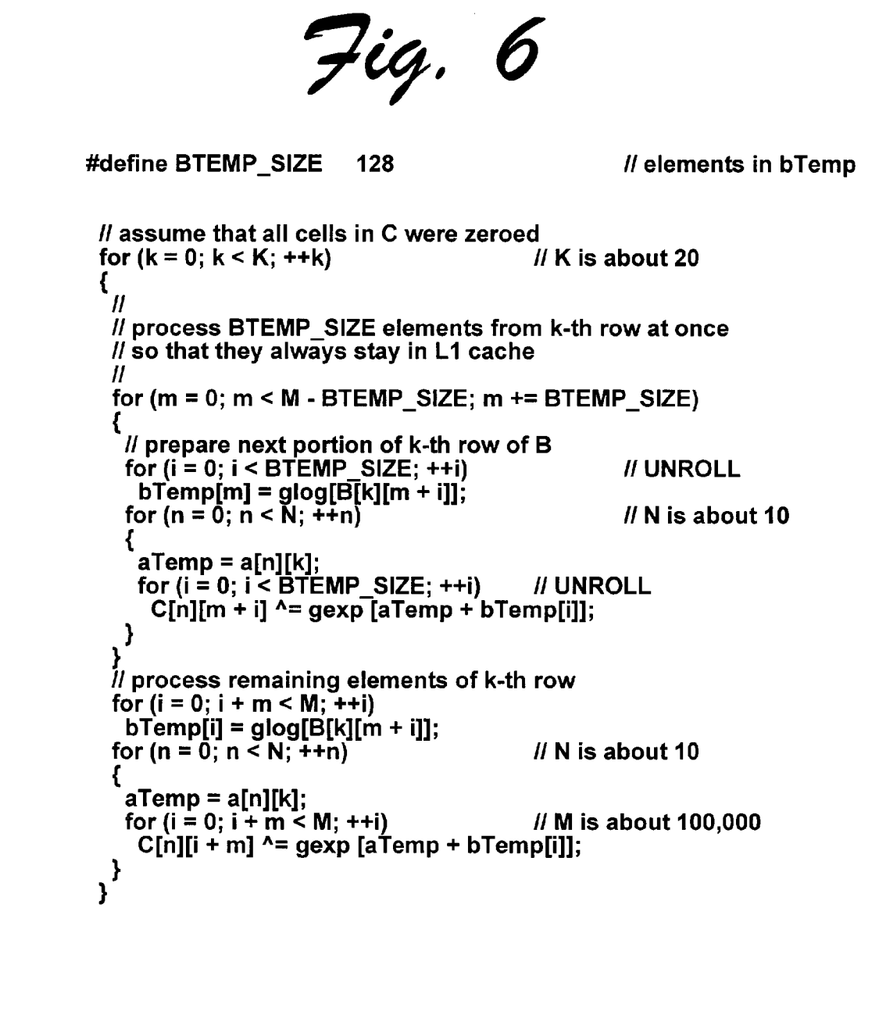

The size of temporary array bTemp may be too large to fit into the L1 cache (e.g. the value of M is typically approximately 4,000 bytes). A further efficiency can be achieved by processing matrix B is several stages. To do so, instead of processing an entire row of matrix B in the inner loop—precalculating $g\log[B_{k,m}]$ for the entire k-th row of B—it is more efficient to first precompute logarithms for a portion of the k-th row of matrix B that will fit into L1 cache. Then, the processing will perform all necessary calculations and proceed to the next small portion of the k-th row of matrix B until the entire matrix B is processed. Any example of such an implementation is depicted by the code seen in FIG. 6. Note from FIG. 6 that it is desirable that the size of BTEMP_SIZE for the array bTemp should be relatively small so that the array bTemp and respective portions of array C will fit into L1 cache. As such:

BTEMP_SIZE*(Size of 1-Element of
  'bTemp'Array)+N(Size of Cache Line)≦
  (Size of L1).

The implementation depicted by the code seen in FIG. 6 demonstrates that each element $C_{n,i+m}$ can be calculated by gexp[aTemp+bTemp[i]] during which:

--- i is looped from zero to (i+m)<M within loops of n which is looped from 0 to (N−1) to compute: aTemp = a'$_{n,k}$;
i is looped from zero to i+m<M within loops of k from 0 to (K−1) to compute: bTemp[i] = glog(B$_{k,m+1}$).

---

Then, each element $C_{n,m+1}$, can be calculated using gexp [aTemp+bTemp[i]] during which:

--- i is looped within 0 to (BTempSize−1) within loops of n from 0 to (N−1) to compute: aTemp = a'$_{n,k}$; and
i is looped from 0 to (BTempSize−1) within each loop of m from 0 to (M−BTempSize) that is within each loop of k from 0 to (K−1) to compute: bTemp[m] = glog(B$_{k,m+1}$).

---

For the foregoing, it is preferably that BTempSize is the size of the bTemp array, X=the sum of:
  N multiplied by the size of the cache line for the computer; and the BTempSize multiplied by the size of one element of the bTemp array.

As such, the size of the lowest level of the cache (e.g. L1) should not be less than X.

Compliers compile a program written in programming language code into machine code that can be executed by a CPU. The compiler, however, may not necessarily compile the code such that the machine code will be executed by the CPU in the most efficient manner. To employ further efficiencies, the program can be written to remove loop invariant computations. One type of loop invariant computations that can be removed from executable machine language by programming in a certain fashion are hidden address computations. Such programming will optimize the compiler by moving address computations out of the inner loop computations. Any example of this type of programming is seen in the code depicted in FIG. 7.

Figure 7:
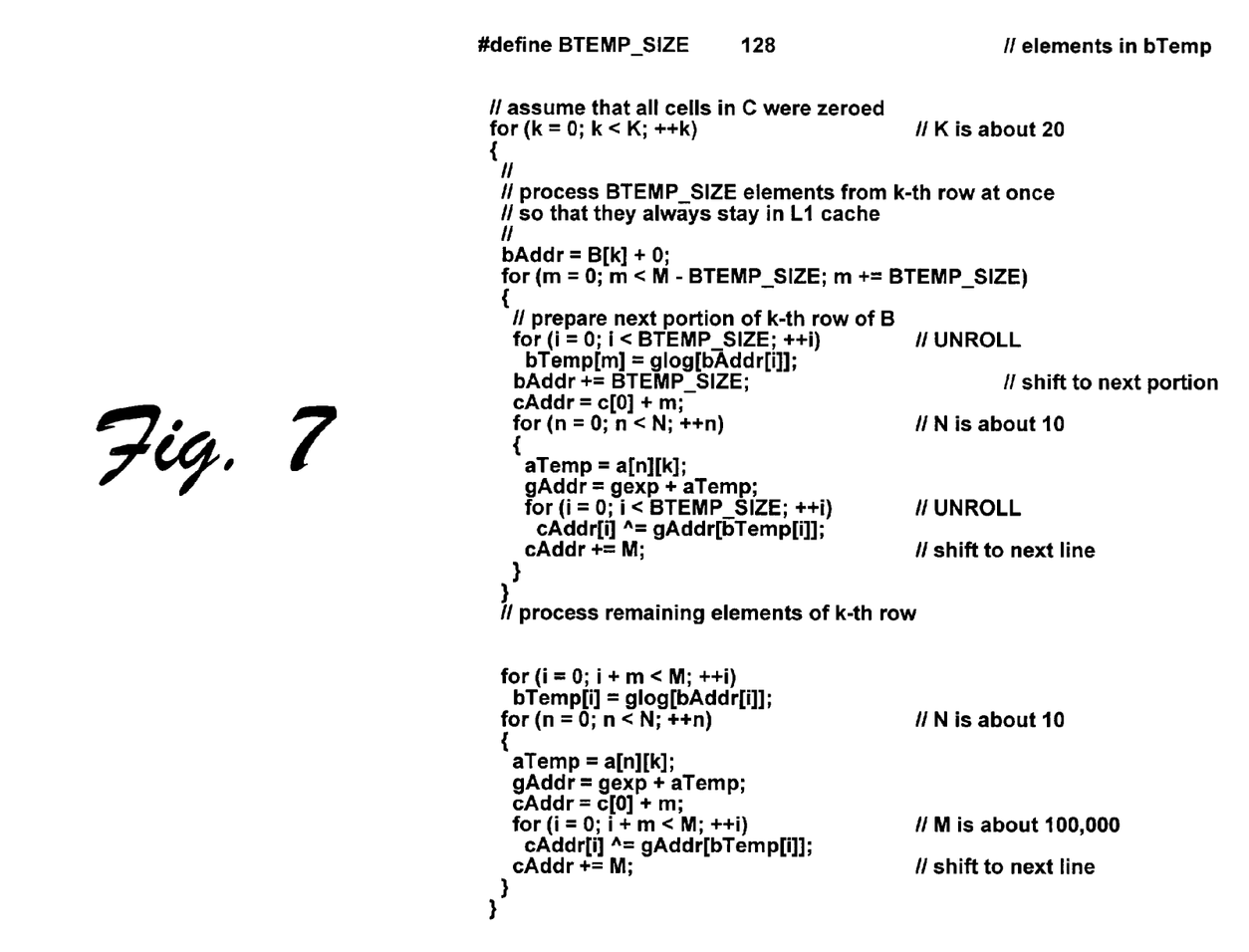

When comparing FIG. 7 to FIG. 6, the matrix multiplication algorithm in FIG. 6 can be seen to contain may loop invariant computations in the form of hidden address computations, such as where C[n][i+m] is transformed by the compiler into (address(C)+n*M+m+i) or the like. By moving the computations of (address(C)+n*M+m) out of the inner loop, the compiler is optimized as to the machine code that will be executed by the CPU. The code seen in FIG. 7 has many loop invariants removed for better efficiency which is desirable, particularly if the complier that compiles the programming code is a non-optimizing compiler.

Figure 8:
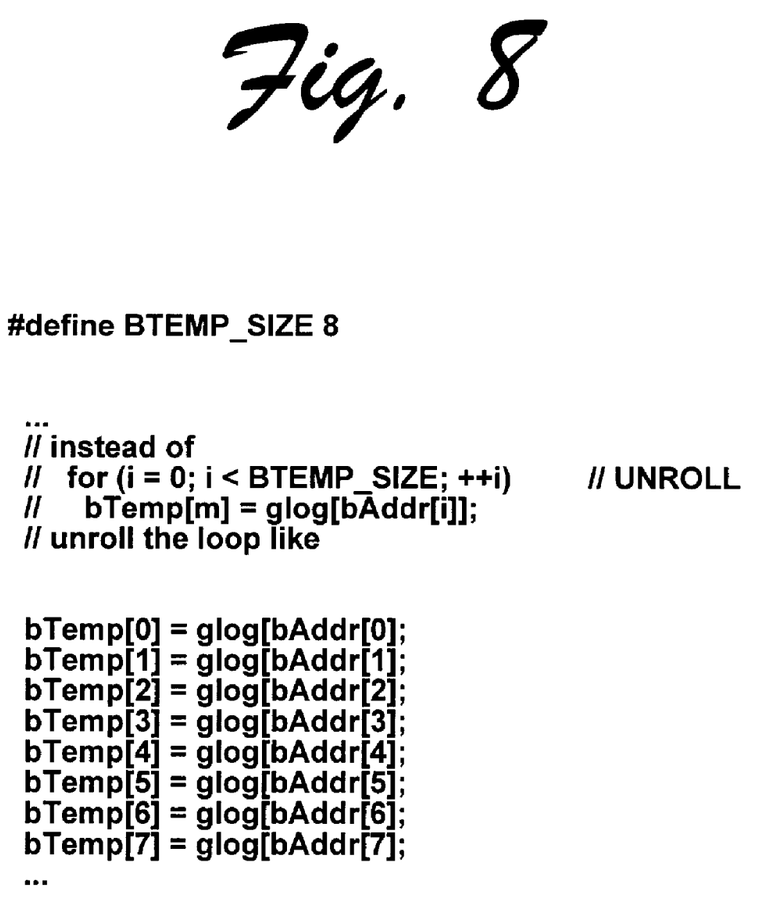

It is desirable to optimize loop unrolling. The code seen in FIG. 7 has the loops thereof marked by the "// UNROLL" comment. These loops are the inner, most frequently executed loops where the majority of time is spent during execution. These loops have a fixed and known number of iterations (namely, BTEMP_SIZE times). Since BTEMP_SIZE may be fairly large (e.g. few hundreds), it is possible that an optimized compiler will not unroll the loop body as many times as possible so as to achieve the highest degree of efficiency. To accomplish such as high degree of efficiency, the unrolling can be performed as seen in the code depicted in FIG. 8. For example, when BTEMP_SIZE=8, with respect to the unrolling of the loops, the CPU is required to execute in a sequential and thus predictable manner in just a few commands. The loop counter is incremented and compared to the loop exit bound. A conditional jump is performed at the beginning of the loop such that the few commands in the original loop are not executed anymore.

Conclusion

Implementations described above improve the performance of matrix multiplication in a Galois field having a size of 256 bytes ($GF(2^8)$) for FEC-specific implementations, thus increasing both the capacity and throughput of transreceived data. These implementations are more efficient for multiplication of narrow matrixes in a Galois field than traditional blocking algorithms. In addition, the invention also contemplates implementations thereof that employ multiplication of narrow matrixes that are not necessarily in a Galois field and/or that employ multiplication of matrixes that are not necessarily narrow matrixes in a Galois field.

Exemplary Computer Environment

Figure 9:
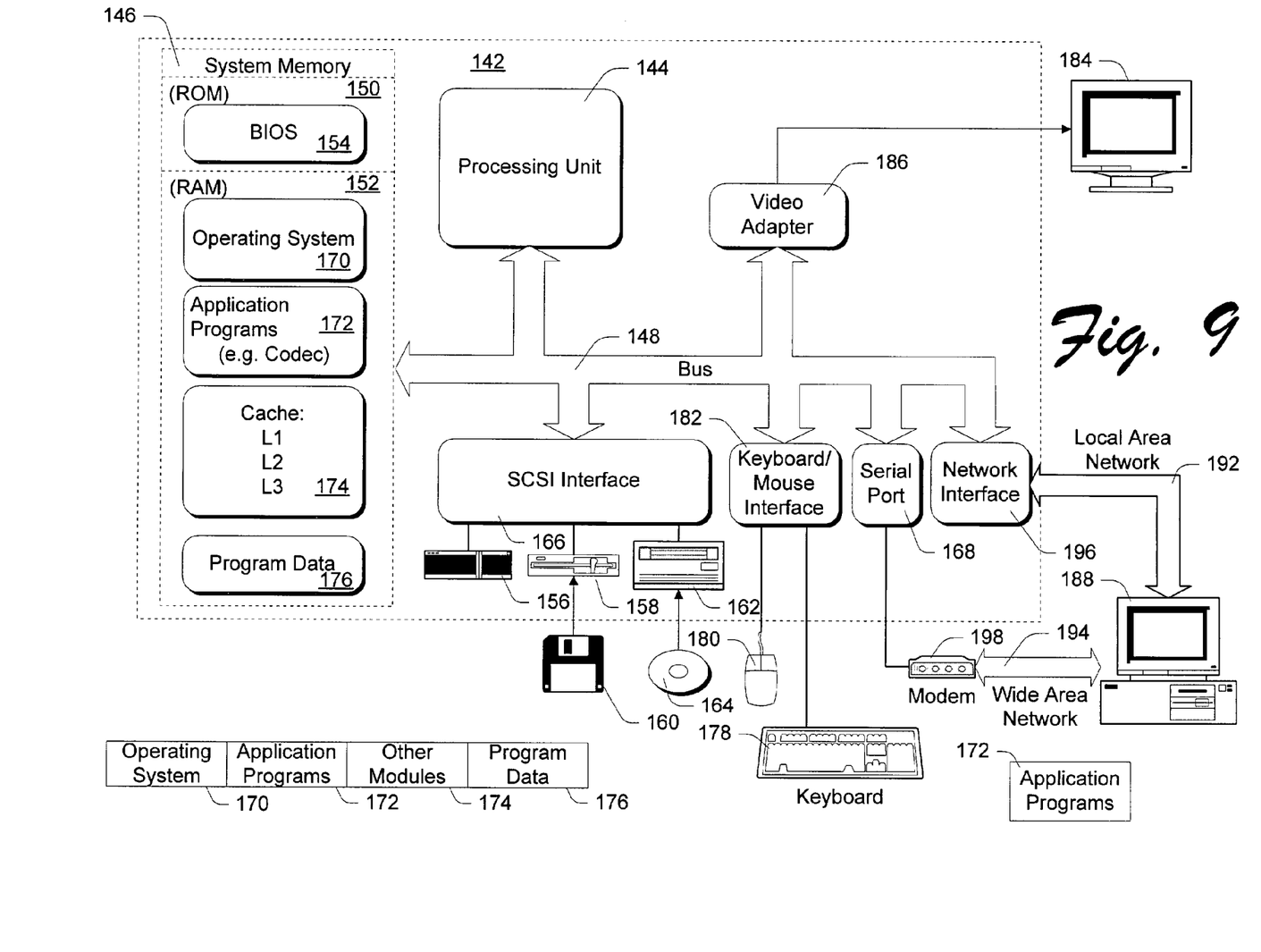
FIG. 9 is a block diagram, in accordance with an implementation, of a networked computer that can be used to implement either a server or a client.

FIG. 9 shows a general example of a computer 142 that can be used in accordance with the invention. Computer 142 is shown as an example of a computer that can perform the functions of any of network client computers 104 or network server computers 102 of FIG. 1. Computer 142 includes one or more CPUs, processors, or processing units 144, a system memory 146, and a system bus 148 that couples various system components including the system memory 146 to processors 144.

The bus 148 represents one or more of any of several types of bus structures, including a memory bus or memory controller, a peripheral bus, an accelerated graphics port, and a processor or local bus using any of a variety of bus architectures. The system memory includes read only memory (ROM) 150 and random access memory (RAM) 152. A basic input/output system (BIOS) 154, containing the basic routines that help to transfer information between elements within computer 142, such as during start-up, is stored in ROM 150. Computer 142 further includes a hard disk drive 156 for reading from and writing to a hard disk (not shown), a magnetic disk drive 158 for reading from and writing to a removable magnetic disk 160, and an optical disk drive 162 for reading from or writing to a removable optical disk 164 such as a CD-RW, a CD-R, a CD ROM, or other optical media.

Any of the hard disk (not shown), magnetic disk drive 158, optical disk drive 162, or removable optical disk 164 can be an information medium having recorded information thereon. The information medium can have a data area for recording stream data. By way of example, encoding and decoding can be performed by a codec executing in processing unit 144. As such, the encoder distributes the stream data so that the distributed stream data can be recorded using an encoding algorithm, such as is used by an encoder.

The hard disk drive 156, magnetic disk drive 158, and optical disk drive 162 are connected to the system bus 148 by an SCSI interface 166 or some other appropriate interface. The drives and their associated computer-readable media provide nonvolatile storage of computer readable instructions, data structures, program modules and other data for computer 142. Although the exemplary environment described herein employs a hard disk, a removable magnetic disk 160 and a removable optical disk 164, it should be appreciated by those skilled in the art that other types of computer readable media which can store data that is accessible by a computer, such as magnetic cassettes, flash memory cards, digital video disks, random access memories (RAMs), read only memories (ROM), and the like, may also be used in the exemplary operating environment.

A number of program modules may be stored on the hard disk, magnetic disk 160, optical disk 164, ROM 150, or RAM 152, including an operating system 170, one or more application programs 172 such as a coder/decoder (e.g. a codec), a multilevel cache 174 including partition levels L1–L3 thereof, and program data 176. Alternatively, the codec can be implemented, in whole or in part, by special purpose hardware. A user may enter commands and information into computer 142 through input devices such as keyboard 178 and pointing device 180. Other input devices (not shown) may include a microphone, joystick, game pad, satellite dish, scanner, or the like. These and other input devices are connected to the processing unit 144 through an interface 182 that is coupled to the system bus 148. A monitor 184 or other type of display device is also connected to the system bus 148 via an interface, such as a video adapter 186. In addition to the monitor 184, personal computers typically include other peripheral output devices (not shown) such as speakers and printers.

Computer 142 operates in a networked environment using logical connections to one or more remote computers, such as a remote computer 188. The remote computer 188 may be another personal computer, a server, a router, a network PC, a peer device or other common network node, and typically includes many or all of the elements described above relative to computer 142. The logical connections depicted in FIG. 9 include a local area network (LAN) 192 and a wide area network (WAN) 194. Such networking environments are commonplace in offices, enterprise-wide computer networks, intranets, and the Internet. In the described embodiment of the invention, remote computer 188 executes an Internet Web browser program such as the Internet Explorer ® Web browser manufactured and distributed by Microsoft Corporation of Redmond, Wash.

When used in a LAN networking environment, computer 142 is connected to the local network 192 through a network interface or adapter 196. When used in a WAN networking environment, computer 142 typically includes a modem 198 or other means for establishing communications over the wide area network 194, such as the Internet. The modem 198, which may be internal or external, is connected to the system bus 148 via a serial port interface 168. In a networked environment, program modules depicted relative to the personal computer 142, or portions thereof, may be stored in the remote memory storage device. It will be appreciated that the network connections shown are exemplary and other means of establishing a communications link between the computers may be used.

Generally, the data processors of computer 142 are programmed by means of instructions stored at different times in the various computer-readable storage media of the computer. Programs and operating systems are typically distributed, for example, on floppy disks or CD-ROMs. From there, they are installed or loaded into the secondary memory of a computer. At execution, they are loaded at least partially into the computer's primary electronic memory. The invention described herein includes these and other various types of computer-readable storage media when such media contain instructions or programs for implementing the steps described above in conjunction with a microprocessor or other data processor. The invention also includes the computer itself when programmed according to the methods and techniques described above. Furthermore, certain sub-components of the computer may be programmed to perform the functions and steps described above. The invention includes such sub-components when they are programmed as above.

For purposes of illustration, programs and other executable program components such as the operating system are illustrated herein as discrete blocks, although it is recognized that such programs and components reside at various times in different storage components of the computer, and are executed by the data processor(s) of the computer.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A computer readable medium having computer executable instructions thereon that, when executed by a computer, perform a method comprising deriving a matrix C for a transmission package that is capable of being transmitted or received, the transmission package also including K blocks of data in a matrix B, wherein:

the matrix B includes elements $B_{k,m}$;

the matrix C includes elements $C_{n,m}$ for forward error correction for the K blocks of data, with K being an integer;

the kth row of matrix B is a binary expression of one block of the data and has a value from 0 to (K−1);

the m is a matrix column number and has a value from 0 to (M−1);

the M is the number of symbols in each block of the data;

the nth row of matrix C is a binary expression of one redundant block of the data and has a value from 0 to (N−1);

a matrix A has elements $A_{n,k}$ with N rows and K columns;

a function GExp maps integer values;

a function GLog maps integer values;

the elements of the matrices are from a Galois field of size P, with P being an integer; and the method further comprises computer-implemented actions of:

forming one-dimensional arrays glog with P elements and gexp with 4P−5 elements, wherein, for a Galois field having a size P (GF(P)):

j is an integer having a value from 0 to P−1;

glog(j)=GLog(j), if j≠0;

glog(j)=(2P−3), if j=0;

j is an integer having a value from 0 to 4P−6 gexp(j)=GExp(j mod P−1), if j<(2P−3); and gexp(j)=0, if j≧(2P−3);

evaluating $C_{n,m}$ by substituting GLog and GExp by respective lookups in the array glog and in the array gexp and removing the modulo as:

$$C_{n,m} = \underset{k=0}{\overset{K-1}{XOR}}\ gexp[glog[A_{n,k}] + glog[B_{k,m}]].$$

2. The computer readable medium as defined in claim 1, wherein neither the glog array nor the gexp array is larger than $3.2 \times 10^4$ bytes.

3. The computer readable medium as defined in claim 1, wherein:
P is not more than 256;
N is not more than 100;
K is not more than 100; and
M is at least 4,000.

4. The computer readable medium as defined in claim 1, wherein:
the size of the matrix A is not more than $3.2 \times 10^4$ bytes;
the size of the matrix B is not less than $2 \times 10^4$ bytes; and
the size of the matrix C is not less than $10^4$ bytes.

5. A computer readable medium having computer executable instructions thereon that, when executed by a computer, perform a method comprising a computer-implemented action of deriving K rows of data in a matrix B having elements $B_{k,m}$, wherein:
at least a portion of the K, with K being an integer, rows of the data are in a transmission package that is transmitted or received electronically by the computer;
each row k from 0 to the (K−1)-th row of the data of matrix B is a binary expression;
the m is a matrix column number from 0 to (M−1)-th column
the transmission package includes a matrix C having elements $C_{n,m}$ for forward error correction for the K rows of the data;
each row n from 0 to an (N−1)th row in the matrix C is redundant with the data in matrix B and is a binary expression;
a function GExp maps integer values;
a function GLog maps integer values;
an array gexp is a one-dimensional precomputed array;
an array glog is a one-dimensional precomputed array;
each element $C_{n,m}$ is computed by the computer for a Galois field having a size P, with P being an integer, (GF(P)) by XOR'ing $GExp[(GLog[A_{n,k}]+GLog[B_{k,m}])$ mod (P−1)] for k from 0 to K−1;
each element $A_{n,k}$ is in a matrix A having N rows and K columns;
the GExp and the GLog are each retrieved by the computer from gexp and glog, respectively;
the matrix A is derived by the computer from the transmission package; and
the K rows of the data in the matrix B are derived by the computer from the matrices A and C.

6. The computer readable medium as defined in claim 5, wherein:
each row in the C matrix in the transmission package has an error check sum;
the error check sum is tested to determine if at least some of the K rows of the data in the transmission package bad been lost; and
the K rows of data in the matrix B are derived when the testing of the error check sum determines that at least some of the K rows of the data in the transmission package bad been lost.

7. The computer readable medium as defined in claim 5, wherein:
glog(j)=GLog(j) if j≠0;
glog(j)=(2P−3) if j=0;
gexp(j)=GExp(j mod P−1)) if j<(2P−3); and
gexp(j)=0 if j≧(2P−3).

8. The computer readable medium as defined in claim 5, wherein:
for each element $A_{n,k}$ in matrix A, $glog[A_{n,k}]$ is evaluated to form a matrix A' having elements $a'_{n,k}$; and
each element $C_{n,m}$ is calculated as XOR'ing $gexp[a'_{n,k}+glog[B_{k,m}]]$ from k=0 to K−1.

9. The computer readable medium as defined in claim 8, wherein the calculation of $C_{n,m}$ using $gexp[a'_{n,k}+glog[B_{k,m}]]$ is processed in the sequence of:
looping m from 0 to (M−1) within each loop of k from 0 to (K−1); and
looping each loop of k within each loop of n from 0 to (N−1).

10. The computer readable medium as defined in claim 9, wherein:
for each loop of k within each loop of n, aTemp=a[n][k] is calculated, where a[n][k] represents an element of the matrix A' under the loop processing; and
for each loop of m within each loop of k, the calculation of $gexp[a'_{n,k}+glog[B_{k,m}]]$ is replaced with $gexp[aTemp+glog[B_{k,m}]]$.

11. The computer readable medium as defined in claim 8, wherein the calculation of $C_{n,m}$ using $gexp[a'_{n,k}+glog[B_{k,m}]]$ is replaced with the calculation gexp[aTemp+bTemp[m]] in a processing sequence of:
each m is looped within each loop of n to compute aTemp=$a'_{n,k}$;
each n is looped within each loop of k; and
each m is looped within each loop of k to compute bTemp[m]=$glog[B_{k,m}]$.

12. The computer readable medium as defined in claim 5, wherein:
P is not more than 256;
N is not more than 100;
K is not more than 100; and
M is at least 4,000.

13. The computer readable medium as defined in claim 5, wherein:
the number of the $A_{n,k}$ elements in matrix A is not more than $3.2 \times 10^4$;
the number of the $B_{k,m}$ elements in matrix B is not less than $2 \times 10^4$; and
the number of the $C_{n,m}$ elements in matrix C is not less than $10^4$.

14. A decoding apparatus comprising means for receiving the transmission package and a decoder including a CPU for executing the computer executable instructions on the computer readable medium to perform the method of claim 5.

15. A system comprising a client computer coupled to a network to transmit a request for the K rows of the data, and a server computer coupled to the network transmit the transmission package to the client computer in response to the request via the network, wherein each of the client computer and the server computer have a codec for executing the computer executable instructions on the computer readable medium to perform the method of claim 5.

16. A computer readable medium having computer executable instructions thereon that, when executed by a computer, perform a method comprising deriving a matrix C for a transmission package that is capable of being transmitted or received, the transmission package also including K blocks of data in a matrix B, wherein:
the matrix B includes elements $B_{k,m}$;
the matrix C includes elements $C_{n,m}$ for forward error correction for the K blocks of data, with K being an integer;
the kth row of matrix B is a binary expression of one block of the data and has value from 0 to (K−1);
the m is a matrix column number and has a value from 0 to (M−1);
the M is the number of symbols in each block of the data;

the nth row of matrix C is a binary expression of one redundant block of the data and has a value from 0 to (N−1);
a function GExp maps integer values;
a function Glog maps integer values;
a matrix A has elements $A_{n,k}$ and includes N rows and K columns; and
the method further comprises computer-implemented actions of:
forming one-dimensional arrays glog having P, with P being an integer, elements and gexp having 4P−5 elements, wherein, for a Galois field having a size P (GF(P)):
j is an integer having a value from 0 to P−1;
glog(j)=GLog(j) if j≠0;
glog(j)=(2P−3) if j=0;
j is an integer having a value from 0 to 4P−6
gexp(j)=GExp(j mod P−1)) if j<(2P−3); and gexp(j)=0 if j≧(2P−3);
for each element $A_{n,k}$ in matrix A, evaluating glog[$A_{n,k}$] to form a matrix A' having elements $a'_{n,k}$; and calculating each element $C_{n,m}$ $$C_{n,m} = \underset{k=0}{\overset{K-1}{XOR}} = g\exp[a'_{n,k} + g\log[B_{k,m}]].$$

17. The computer readable medium as defined in claim 16, wherein:
the size of the matrix A' is not more than $3.2 \times 10^4$ bytes;
P is not more than 256;
N is not more than 100;
K is not more than 100; and
M is at least 4,000.

18. The computer readable medium as defined in claim 16, wherein neither the glog array nor the gexp array is larger than $3.2 \times 10^4$ bytes.

19. The computer readable medium as defined in claim 16, wherein:
the size of the matrix A is not more than $3.2 \times 10^4$ bytes;
the size of the matrix B is not less than $2 \times 10^4$ bytes; and
the size of the matrix C is not less than $10^4$ bytes.

20. A computer readable medium having computer executable instructions thereon that, when executed by a computer, perform a method comprising deriving a matrix C for a transmission package that is capable of being transmitted or received, the transmission package also including K blocks of data in a matrix B, wherein:
the matrix B includes elements $B_{k,m}$;
the matrix C includes elements $C_{n,m}$ for forward error correction for the K blocks of data, with K being an integer;
the kth row of matrix B is a binary expression of one block of the data and has a value from 0 to (K−1);
the m is a matrix column number and has a value from 0 to (M−1);
the M is the number of symbols in each block of the data;
the nth row of matrix C is a binary expression of one redundant block of the data and has a value from 0 to (N−1);
a function GExp maps integer values;
a function GLog maps integer values;
a matrix A has elements $A_{n,k}$ and includes N rows and K columns; and the method further comprises computer-implemented actions of:
forming one-dimensional arrays glog having P, with P being an integer, elements and gexp having 4P−5 elements, wherein, for a Galois field having a size P (GF(P)):
j is an integer having a value from 0 to P−1;
glog(j)=GLog(j) if j≠0;
glog(j)=(2P−3) if j=0;
j is an integer having a value from 0 to 4P−6
gexp(j)=GExp(j mod P−1)) if j<(2P−3); and
gexp(j)=0 if j≧(2P−3);
for each element $A_{n,k}$ in matrix A, evaluating glog[$A_{n,k}$] to form a matrix A' having elements $a'_{n,k}$; and
calculating each element $C_{n,m}$, $$C_{n,m} = \underset{k=0}{\overset{K-1}{XOR}} = g\exp[a'_{n,k} + g\log[B_{k,m}]],$$

during which m is looped within k and k is looped within n.

21. The computer readable medium as defined in claim 20, wherein performing the calculation of each element $C_{n,m}$ further comprises:
for each loop of k within in n, calculate aTemp=a[n][k]; and
for each loop of m within k, replace the calculation of gexp[$a'_{n,k}$+glog[$B_{k,m}$]] with gexp[aTemp+glog[$B_{k,m}$]].

22. The computer readable medium as defined in claim 20, wherein:
P is not more than 256;
N is not more than 100;
K is not more than 100; and
M is at least 4,000.

23. The computer readable medium as defined in claim 20, wherein:
the number of the $A_{n,k}$ elements in matrix A is not more than $3.2 \times 10^4$;
the number of the $B_{k,m}$ elements in matrix B is not less than $2 \times 10^4$; and
the number of the $C_{n,m}$ elements in matrix C is not less than $10^4$.

24. A computer readable medium having computer executable instructions thereon that, when executed by a computer, perform a method comprising deriving a matrix C for a transmission package that is capable of being transmitted or received, the transmission package also including K blocks of data in a matrix B, wherein:
the matrix B includes elements $B_{k,m}$;
the matrix C includes elements $C_{n,m}$ for forward error correction for the K blocks of data, with K being an integer;
the kth row of matrix B is a binary expression of one block of the data and has a value from 0 to (K−1);
the m is a matrix column number and has a value from 0 to (M−1);
the M is the number of symbols in each block of the data;
the nth row of matrix C is a binary expression of one redundant block of the data and has a value from 0 to (N−1);
a function GExp maps integer values;
a function GLog maps integer values;
a matrix A has elements $A_{n,k}$ and includes N rows and K columns; and the method further comprises computer-implemented actions of:
forming one-dimensional arrays glog having P, with P being an integer, elements and gexp having 4P−5 elements, wherein, for a Galois field having a size P (GF(P)):
j is an integer having a value from 0 to P−1;
glog(j)=GLog(j) if j≠0;
glog(j)=(2P−3) if j=0;
j is an integer having a value form 0 to 4P−6
gexp(j)=GExp(j mod P−1)) if j<(2P−3); and
gexp(j)=0 if j≧(2P−3);
for each element $A_{n,k}$ in matrix A, evaluating glog[$A_{n,k}$] to form a matrix A' having elements $a'_{n,k}$;
calculating each element $C_{n,m}$=gexp[aTemp+bTemp[m]] during which:
m is looped within n to compute aTemp=$a'_{n,k}$;
n is looped within k; and
m is looped within k to compute bTemp[m]=glog[$B_{k,m}$]].

25. The computer readable medium as defined in claim 24, wherein:
P is not more than 256;
N is not more than 100;
K is not more than 100; and
M is at least 4,000.

26. The computer readable medium as defined in claim 24, wherein:
the number of the $A_{n,k}$ elements in matrix A is not more than $3.2 \times 10^4$;
the number of the $B_{k,m}$ elements in matrix B is not less than $2 \times 10^4$; and
the number of the $C_{n,m}$ elements in matrix C is not less than $10^4$.

27. A computer readable medium having computer executable instructions thereon that, when executed by a computer, perform a method comprising deriving a matrix C for a transmission package that is capable of being transmitted or received, the transmission package also including K blocks of data in a matrix B, wherein:
the matrix B includes elements $B_{k,m}$;
the matrix C includes elements $C_{n,m}$ for forward error correction for the K blocks of data, with K being an integer;
the kth row of matrix B is a binary expression of one block of the data and has a value from 0 to (K−1);
the m is a matrix column number and has a value from 0 to (M−1);
the M is the number of symbols in each block of the data;
the nth row of matrix C is a binary expression of one redundant block of the data and has a value from 0 to (N−1);
a function GExp maps integer values;
a function GLog maps integer values;
a matrix A has elements $A_{n,k}$ and includes N rows and K columns; and
the method further comprises computer-implemented actions of:
forming one-dimensional arrays glog having P, with P being an integer, elements and gexp having 4P−5 elements, wherein, for a Galois field having a size P (GF(P));
j is an integer having a value from 0 to P−1;
glog(j)=GLog(j) if j≠0;
glog(j)=(2P−3) if j=0;
j is an integer having a value from 0 to 4P−6
gexp(j)=GExp(j mod P−1)) if j<(2P−3); and
gexp(j)=0 if j≧(2P−3);
for each element $A_{n,k}$ in matrix A, evaluating glog[$A_{n,k}$] to form a matrix A' having elements $a'_{n,k}$;
calculating each element $C_{n,i+m}$=XOR gexp[aTemp+bTemp[i]] during which:

i is looped from zero to (i+m)<M within loops of n which is looped from 0 to (N−1) to compute: aTemp = $a'_{n,k}$;
i is looped from zero to i+m<M within loops of k from 0 to (K−1) to compute: bTemp[i] = glog($B_{k,m+1}$);

calculating each element $C_{n,m+i}$=XOR gexp[aTemp+bTemp[i]] during which:

i is looped within from 0 to (BTempSize−1) within loops of n from 0 to (N−1) to compute: aTemp = $a'_{n,k}$;
i is looped from 0 to (BTempSize−1) within a loop of m from 0 to (M − BTempSize) that is within loops of k from 0 to (K−1) to compute: bTemp[m] = glog($B_{k,m+1}$).

28. The computer readable medium as defined in claim 27, wherein:
BTempSize is the size of the bTemp array.

29. The computer readable medium as defined in claim 27, wherein:
the computer has multiple levels of cache;
the lowest level cache has a cache line having a size;
X=the sum of:
N multiplied by the size of the cache line for the computer; and
the BTempSize multiplied by the size of one element of the bTemp array;
the size of the lowest level of the cache is not less than X.

30. The computer readable medium as defined in claim 27, wherein:
the BTempSize is not more than 256;
P is not more than 256;
N is not more than 100;
K is not more than 100; and
M is at least 4000.

31. The computer readable medium as defined in claim 27, wherein:
the number of the $A_{n,k}$ elements in matrix A is not more than $3.2 \times 10^4$;
the number of the $B_{k,m}$ elements in matrix B is not less than $2 \times 10^4$; and
the number of the $C_{n,m}$ elements in matrix C is not less than $10^4$.

32. The computer readable medium as defined in claim 27, wherein the method further comprises:
prior to a transmission of the transmission package:
forming the matrix B by logically organizing the data to be transmitted into K rows and M columns with the elements $B_{k,m}$;
picking the matrix A with N rows and K columns so as to be able to perfectly reconstruct B when up to N rows of data from B and C are lost;
after deriving the matrix C by performing matrix multiplication over a Galois field as C=A*B:
forming the transmission package to include matrices B and C; and
transmitting the transmission package.

33. The computer readable medium as defined in claim 27, wherein:

the transmission package includes an error check sum; and the method further comprises, after receiving the transmission package and when the error check sum indicates that at least some of the data in the transmission package prior to a transmission thereof had been lost:

deriving an inverse of the matrix A by using information on the lost rows of matrices B and C in the transmission package; and deriving the data in the matrix B from the derived matrices A and C.

* * * * *